US009064929B2

(12) United States Patent
Akiyama et al.

(10) Patent No.: US 9,064,929 B2
(45) Date of Patent: Jun. 23, 2015

(54) METHOD FOR REDUCING THE THICKNESS OF AN SOI LAYER

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 1368 days.

(21) Appl. No.: 12/153,519

(22) Filed: May 20, 2008

(65) Prior Publication Data

US 2008/0299742 A1 Dec. 4, 2008

(30) Foreign Application Priority Data

May 30, 2007 (JP) ................... 2007-144075

(51) Int. Cl.
*H01L 21/762* (2006.01)
*H01L 21/3065* (2006.01)
*H01L 21/66* (2006.01)

(52) U.S. Cl.
CPC ...... *H01L 21/76254* (2013.01); *H01L 21/3065* (2013.01); *H01L 22/12* (2013.01); *H01L 22/20* (2013.01); *H01L 2924/014* (2013.01)

(58) Field of Classification Search
CPC .............................................. H01L 21/76254
See application file for complete search history.

(56) References Cited

U.S. PATENT DOCUMENTS

| 5,254,830 | A | | 10/1993 | Zarowin et al. |
| 5,882,987 | A | * | 3/1999 | Srikrishnan .................. 438/458 |
| 6,004,866 | A | | 12/1999 | Nakano et al. |
| 6,263,941 | B1 | | 7/2001 | Bryan et al. |
| 6,513,564 | B2 | | 2/2003 | Bryan et al. |
| 6,537,606 | B2 | * | 3/2003 | Allen et al. .................. 427/9 |
| 6,582,999 | B2 | | 6/2003 | Henley et al. |
| 2004/0137698 | A1 | * | 7/2004 | Taraschi et al. .............. 438/458 |
| 2004/0248380 | A1 | | 12/2004 | Aulnette et al. |

FOREIGN PATENT DOCUMENTS

| EP | 0 514 046 A1 | 11/1992 |
| EP | 0 797 248 A2 | 9/1997 |

(Continued)

OTHER PUBLICATIONS

A.J. Auberton-Herve et al; "Smart Cut Technology: Inudstrial Status of SOI Wafer Production and New Material Developments". Electrochemical Society Proceedings vol. 99-3, pp. 93-106. 1999.

(Continued)

*Primary Examiner* — Thanh V Pham
(74) *Attorney, Agent, or Firm* — Oliff PLC

(57) ABSTRACT

There is disclosed a method for manufacturing an SOI wafer comprising: a step of implanting at least one of a hydrogen ion and a rare gas ion into a donor wafer to form an ion implanted layer; a step of bonding an ion implanted surface of the donor wafer to a handle wafer; a step of delaminating the donor wafer at the ion implanted layer to reduce a film thickness of the donor wafer, thereby providing an SOI layer; and a step of etching the SOI layer to reduce a thickness of the SOI layer, wherein the etching step includes: a stage of performing rough etching as wet etching; a stage of measuring a film thickness distribution of the SOI layer after the rough etching; and a stage of performing precise etching as dry etching based on the measured film thickness distribution of the SOI layer. There can be provided A method for manufacturing an SOI wafer having high film thickness uniformity of an SOI layer with excellent productivity.

4 Claims, 2 Drawing Sheets

(56) References Cited

FOREIGN PATENT DOCUMENTS

| EP | 1 635 396 A1 | 3/2006 |
|---|---|---|
| JP | A-05-160074 | 6/1993 |
| JP | A-08-293483 | 11/1996 |
| JP | A-9-252100 | 9/1997 |
| JP | A-9-260620 | 10/1997 |
| JP | A-11-145438 | 5/1999 |
| JP | B2-3048201 | 6/2000 |
| JP | A-2005-005674 | 1/2005 |
| JP | A-2007-073878 | 3/2007 |
| WO | WO 98/09804 | 3/1998 |

OTHER PUBLICATIONS

"Science of SOI", Chapter 2. Rearize Corporation. Apr. 19, 2000. A. Matsumura (pp. 7-15); T. Nakai (pp. 16-25); T. Katayama (pp. 26-30); T. Yonehara & K. Sakaguchi (pp. 31-58); N. Tate (pp. 59-66); M. Nakano (pp. 67-74); T. Katayama (pp. 75-78).

European Search Report dated Jul. 8, 2010 in European Patent Application No. 08009379.2.

Jun. 22, 2011 Search Report issued in European Patent Application No. 08 009 379,2.

Dec. 30, 2013 Taiwanese Office Action issued in Taiwanese Application No. 097119148 with partial English-language translation.

May 14, 2014 Korean Office Action issued in Korean Patent Application No. 10-2008-0049695 (with partial English translation).

Aug. 14, 2012 Notification of Reasons for Refusal issued in Japanese Application No. 2007-144075 with partial English-language translation.

Jan. 22, 2013 Notification of Reasons for Refusal issued in Japanese Application No. 2007-144075 with partial English-language translation.

Jun. 11, 2013 Decision of Refusal issued in Japanese Application No. 2007-144075 with partial English-language translation.

\* cited by examiner

METHOD FOR REDUCING THE THICKNESS OF AN SOI LAYER

BACKGROUND OF THE INVENTION

1. Field of the Invention

The present invention relates to a method for manufacturing an SOI wafer, and more particularly to a method for manufacturing an SOI wafer for bonding two wafers to form a thin-film SOI layer by delamination and then further reducing a film thickness of the SOI layer.

2. Description of the Related Art

To reduce a parasitic capacitance and increase performances of a semiconductor device, a silicon-on-insulator (SOI) wafer having a single-crystal silicon layer formed on an insulator has been widely utilized. In recent years, a demand for a thin-film SOI having an SOI layer (a single-crystal silicon layer on an insulator) of 100 nm or below has been increased to fabricate a complete depletion layer type SOI device. That is because an increase in speed of the device by reducing a film thickness of the SOI layer can be expected.

As one of typical methods for fabricating an SOI wafer, there is an ion implantation/delamination method. As one of such methods, there is a Smartcut method (a registered trademark). According to this method, a hydrogen ion is implanted into a single-crystal silicon wafer or a single-crystal silicon wafer having an oxide film formed on a surface thereof (a donor wafer), this wafer is bonded to a support wafer (a handle wafer) and then heated to a temperature close to 500° C., the donor wafer is delaminated along a hydrogen ion implanted interface, a single-crystal silicon thin film is transferred to the handle wafer, and a heat treatment is subsequently performed at a high temperature (approximately 1100 to 1200° C.) by a method for polishing the surface roughened due to a heat treatment to provide a mirror surface or by using an inert gas such as argon or an inert gas having hydrogen added thereto, thereby smoothening the surface (see, e.g., Japanese Patent No. 3048201, Japanese Patent Application Laid-open No. H11-145438, and A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) pp. 93-106)).

However, this method has several problems. Since delamination of the donor wafer is performed by a heat treatment for generating small cavities called micro cavities on the hydrogen ion implanted interface, surface roughness occurs on the surface after delamination. According to Science of SOI, Chapter 2, Realize corporation, a difference of elevation of approximately 65 nm in terms of Peak to Valley (P-V) occurs even in a very narrow region of 1×1 µm. In light of an entire wafer region, it can be considered that a difference of elevation of 100 nm or above occurs. Therefore, a polishing amount of 100 to 150 nm or above is required in order to polish a surface of the SOI layer to eliminate irregularities on the surface of the SOI layer.

In general, accurately and uniformly polishing a surface to obtain a target thickness is difficult in a polishing process called CMP (chemical mechanical polishing). That is because constantly keeping conditions of a radial balance of various factors (e.g., a pressure or a supply amount of a slurry) concerning polishing or a polishing pad in a fixed state is difficult. For example, considering a case where an SOI layer having a film thickness of 250 nm immediately after donor wafer delamination to 100 nm, even if a radial fluctuation of a polishing stock removal is ±10%, a film thickness of a resultant SOI layer is 85 to 115 nm, thereby leading to a film thickness fluctuation of 30%.

On the other hand, in regard to the method for flattening a surface of an SOI layer based on a heat treatment, a lengthy heat treatment of 1100° C. or above is usually required in order to flatten irregularities on the surface of the SOI layer based on the heat treatment. Adding the heat treatment results in occurrence of a problem of, e.g., management of contamination due to a high-temperature process, an increase in cost, or a reduction in productivity. Further, in case of a substrate other than that formed of single-crystal silicon, e.g., a quartz substrate, a glass-transition temperature is near 1050° C., and flattening the surface based on a high-temperature heat treatment may be difficult. Therefore, this method is not desirable.

Furthermore, the method called an SiGen method for bonding two wafers and then mechanically performing delamination at a room temperature (see, e.g., Specification in U.S. Pat. No. 6,263,941, Specification in U.S. Pat. No. 6,513,564, and, Specification in U.S. Pat. No. 6,582,999) also has the same problem as that of the Smartcut method and others, and an SOI layer after delamination must be polished for approximately 0.1 µm to be removed.

Moreover, as a method for fabricating a thin-film SOI layer, there has been proposed, e.g., a PACE (Plasma Assisted Chemical Etching) method (see, e.g., Japanese Patent Application Laid-open No. H5-160074) for previously measuring a film thickness of an SOI layer after delamination and scraping the thin film while applying correction in accordance with a film thickness distribution thereof to fabricate a uniform thin-film silicon layer or a GCIB (Gas Cluster Ion Beam) method (see, e.g., Japanese Patent Application Laid-open No. H8-293483). It can be said that both the methods can meet an object of obtaining an SOI layer having high film thickness uniformity since etching can be performed while correcting a film thickness fluctuation by scanning an entire wafer surface with a plasma or an ion beam having a diameter of several mm to several cm.

However, these methods have a drawback. As different from the method of polishing the entire wafer surface at a time like CMP, a processing time becomes considerably long as compared with that of regular CMP and productivity is lowered since the entire wafer surface is scanned with a plasma nozzle or an ion beam having a small diameter. In recent years in particular, since an increase in a required diameter of an SOI wafer has been advanced, the problem is becoming more serious.

SUMMARY OF THE INVENTION

To solve such a problem, it is an object of the present invention to provide a method for manufacturing an SOI wafer having high film thickness uniformity of an SOI layer with excellent productivity.

To achieve this object, according to the present invention, there is provided a method for manufacturing an SOI wafer comprising at least: a step of preparing a handle wafer and a donor wafer formed of a silicon substrate; an ion implantation step of implanting at least one of a hydrogen ion and a rare gas ion into the donor wafer to form an ion implanted layer; a bonding step of bonding an ion implanted surface of the donor wafer to a bonding surface of the handle wafer; a delamination step of delaminating the donor wafer at the ion implanted layer to reduce a film thickness of the donor wafer, thereby providing an SOI layer; and an etching step of etching the SOI layer to reduce a thickness of the SOI layer, wherein the etching step includes: a stage of performing rough etching as wet etching; a stage of measuring a film thickness distribution of the SOI layer after the rough etching; and a stage of performing precise etching as dry etching based on the measured film thickness distribution of the SOI layer.

As explained above, according to the method for manufacturing an SOI wafer for etching the SOI layer at the etching step including the stage of performing rough etching as wet etching, the stage of measuring the film thickness distribution of the SOI layer subjected to rough etching, and the stage of performing precise etching as dry etching based on the measured film thickness distribution of the SOI layer, etching can be carried out at a relatively high etching rate on the rough etching stage, and film thickness uniformity of the SOI layer can be increased on the precise etching stage. As a result, at the entire etching step for the SOI layer, a high polishing rate and high film thickness uniformity can be obtained, and hence the SOI wafer having the SOI layer with high film thickness uniformity can be manufactured with excellent productivity.

In this case, an etching removal on the precise etching stage can be set smaller than an etching removal on the rough etching stage.

When the etching removal on the precise etching stage is smaller than that on the rough etching stage in this manner, the SOI wafer having the SOI layer with high film thickness uniformity can be further efficiently manufactured.

Moreover, an etching technique on the precise etching stage can be a PACE method or a GCIB method.

When the etching technique on the precise etching stage is the PACE method or the GCIB method in this manner, a highly flat surface of the SOI layer can be obtained.

Additionally, a silicon substrate as the donor wafer can be a single-crystal silicon wafer or a single-crystal silicon wafer having a silicon oxide film formed on a surface thereof.

As explained above, as the silicon substrate that is the donor wafer, a single-crystal silicon wafer or a single-crystal silicon wafer having a silicon oxide film formed on a surface thereof can be used.

Further, it is preferable that the handle wafer is any one of a single-crystal silicon wafer, a single-crystal silicon wafer having a silicon oxide film formed on a surface thereof, a quartz wafer, a glass wafer, an alumina (sapphire) wafer, a SIC wafer, and an aluminum nitride wafer.

The handle wafer used in the present invention can be appropriately selected from these wafers in accordance with an object of a semiconductor device to be fabricated.

Furthermore, the wet etching can be performed by using an etchant containing at least one of KOH, $NH_4OH$, a mixed solution of $NH_4OH+H_2O_2$, NaOH, CsOH, EDP (ethylenediamine-pyrocatechol), TMAH (tetramethylammonium hydroxide), and hydrazine.

The etchant used in the wet etching according to the present invention can be appropriately selected from these materials.

Moreover, the dry etching can be performed by using a gas containing at least one of $SF_6$, $NF_3$, $CF_4$, $CHF_3$, HBr, $Cl_2$, $O_2$, and $H_2$.

The etching gas used in the dry etching according to the present invention can be appropriately selected from these materials.

According to the method for manufacturing an SOI wafer of the present invention, etching can be performed at a relatively high etching rate on the rough etching stage, and film thickness uniformity of the SOI layer can be increased on the precise etching stage. As a result, since a high polishing rate and high film thickness uniformity can be obtained at the entire etching step for the SOI layer, the SOI wafer having the SOI layer with a small film thickness of, e.g., 100 nm or below and high film thickness uniformity can be manufactured with excellent productivity.

DETAILED DESCRIPTION OF THE PREFERRED EMBODIMENTS

The present invention will now be explained hereinafter in detail.

As explained above, when a donor wafer is delaminated and then a thickness of an SOI layer is reduced, a method such as CMP has a problem of degradation in film thickness uniformity. On the other hand, when a PACE method or a GCIB method is used to obtain an SOI layer having high film thickness uniformity based on dry etching, there is a problem that a processing time is long and productivity is considerably low, for example.

The present inventors have performed examinations in order to solve such problems. Basically, the PACE method or the GCIB method is suitable for an object of etching a silicon thin film having an uneven film thickness while correcting film thickness uniformity. Thus, they have considered a method for immersing an SOI wafer obtained after delaminating a donor wafer in an etchant, etching an SOI layer to some extent based on wet etching, and then etching the SOI layer while correcting film thickness uniformity based on dry etching, e.g., the PACE method or the GCIB method. The present inventors have conceived that adopting this method enables correcting film thickness uniformity based on subsequent dry etching even if film thickness uniformity is degraded due to wet etching that is hard to uniformly maintain a film thickness and a total time required for an etching step can be shortened because an etching time of dry etching can be reduced without problem, thereby bringing the present invention to completion.

Although embodiments according to the present invention will now be explained hereinafter with reference to the drawings, the present invention is not restricted thereto. A conformation where a donor wafer is delaminated by a heat treatment will be first explained hereinafter, but the following conformation where the donor wafer is delaminated by applying a mechanical external force may be adopted.

Figure 2:
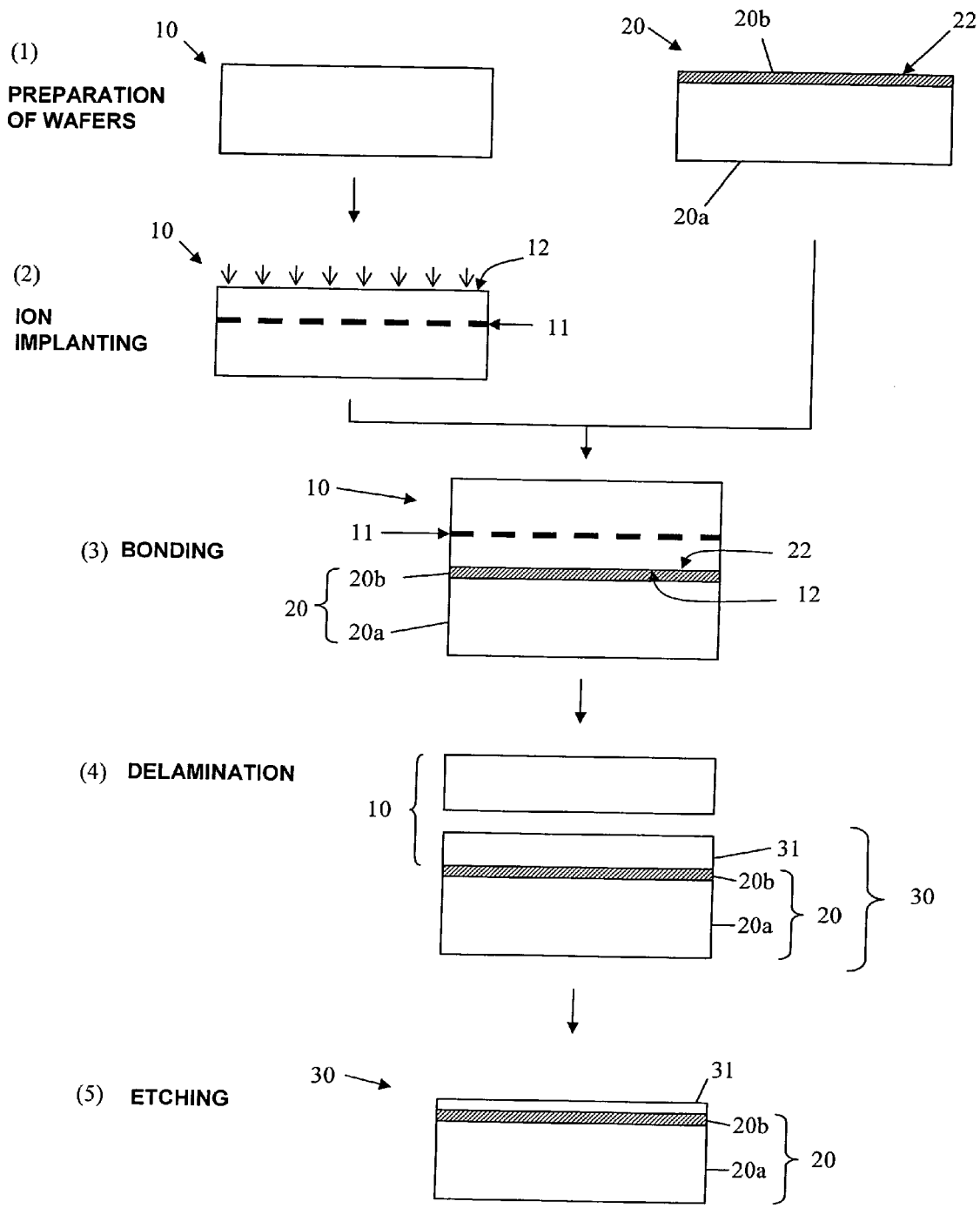
FIG. 2 is a flow diagram showing an example of a method for manufacturing an SOI wafer to which the method for manufacturing an SOI wafer according to the present invention is applied.

FIG. 2 shows an example of a method for manufacturing an SOI wafer to which the present invention can be applied.

First, as shown in FIG. 2(A), a donor wafer 10 formed of a silicon substrate and a handle wafer 20 are prepared (Step 1).

At this time, although the donor wafer 10 is not restricted in particular as long as it is a silicon substrate that can eventually serve as an SOI layer (a single-crystal silicon layer), a single-crystal silicon wafer (a single-crystal silicon wafer formed of single-crystal silicon alone) or a single-crystal silicon wafer having an oxide film formed on a surface thereof can be used, for example. Besides, a single-crystal silicon wafer having a silicon nitride or a silicon oxynitride formed on a surface thereof can be used, for example.

On the other hand, as the handle wafer 20, any one of a single-crystal silicon wafer, a single-crystal silicon wafer having a silicon oxide film formed on a surface thereof, a quartz wafer, a glass wafer, an alumina (sapphire) wafer, a SIC wafer, and an aluminum nitride wafer can be used, for example. The handle wafer 20 can be appropriately selected from these wafers in accordance with an object of a semiconductor device to be fabricated. Of course, any other material can be also used.

However, a combination of the donor wafer 10 and the handle wafer 20 must be a combination that enables eventually forming an SOI structure (a structure where an SOI layer is formed on an insulator) based on bonding.

FIG. 2(1) shows an example of using a single-crystal silicon wafer as the donor wafer 10 and a single-crystal silicon wafer having a silicon oxide film 20b formed on a surface of single-crystal silicon 20a (a single-crystal silicon wafer having an oxide film) as the handle wafer 20.

Then, as shown in FIG. 2(2), a hydrogen ion is implanted into the donor wafer 10 from a surface (an ion implanted surface) 12 thereof to form an ion implanted layer 11 (Step 2).

When forming this ion implanted layer 11, not only the hydrogen ion but a rare gas ion or both the hydrogen ion and the rare gate ion may be implanted. Other ion implantation conditions, e.g., an injection energy, an injection dose, an injection temperature, and others can be appropriately selected so as to obtain a thin film having a predetermined thickness. As a specific example, a temperature of the wafer at the time of injection is set to 250 to 350° C., an ion implantation depth is set to 0.5 μm, an injection energy is set to 20 to 100 keV, and an injection dose is set to $1\times10^{16}$ to $1\times10^{7}/cm^{2}$, but the present invention is not restricted thereto.

It is to be noted that, when a single-crystal silicon wafer having a silicon oxide film formed on a surface thereof is used as the donor wafer 10 to perform ion implantation through the silicon oxide film, an effect of suppressing channeling of the injection ion can be obtained, thereby further suppressing a fluctuation of an ion implantation depth. As a result, an SOI layer having higher film thickness uniformity can be formed.

Then, as shown in FIG. 2(3), the ion implanted surface 12 of the donor wafer 10 is bonded to a bonding surface 22 of the handle wafer 20 (Step 3).

For example, when the ion implanted surface 12 of the donor wafer 10 is brought into contact with the bonding surface 22 of the handle wafer 20 in a clean atmosphere at an ordinary temperature, the wafers can be bonded to each other without using, e.g., an adhesive. At the next Step 4, when delaminating the donor wafer 10 based on a heat treatment, pressing the donor wafer 10 and the handle wafer 20 against each other at a room temperature at this bonding step can suffice.

Subsequently, as shown in FIG. 2(4), delaminating the donor wafer 10 at the ion implanted layer 11 enables reducing a film thickness of the donor wafer 10, thereby providing an SOI layer 31 (Step 4).

For example, when a heat treatment is applied to the bonded wafer in an inert gas atmosphere of, e.g., Ar at a temperature of approximately 500° C. or above for 30 minutes or more, the donor wafer 10 can be delaminated at the ion implanted layer 11 based on rearrangement of a crystal and agglomeration of air bubbles.

In this manner, an SOI wafer 30 having the SOI layer 31 formed on the handle wafer 20 can be obtained.

Then, a bonding heat treatment for increasing a bonding power of the donor wafer 10 and the handle wafer 20 is carried out. For example, this bonding heat treatment can be effected in an inert gas atmosphere or a slightly oxidizing gas atmosphere at 1000° C. to 1250° C. in the range of 30 minutes to 4 hours.

It is to be noted that the delamination heat treatment and the bonding heat treatment can be simultaneously performed.

Subsequently, as shown in FIG. 2(5), the SOI layer 31 is etched to reduce a thickness of the SOI layer 31 (Step 5). Further, the present invention is characterized in that this etching step is performed through the following respective stages.

Figure 1:
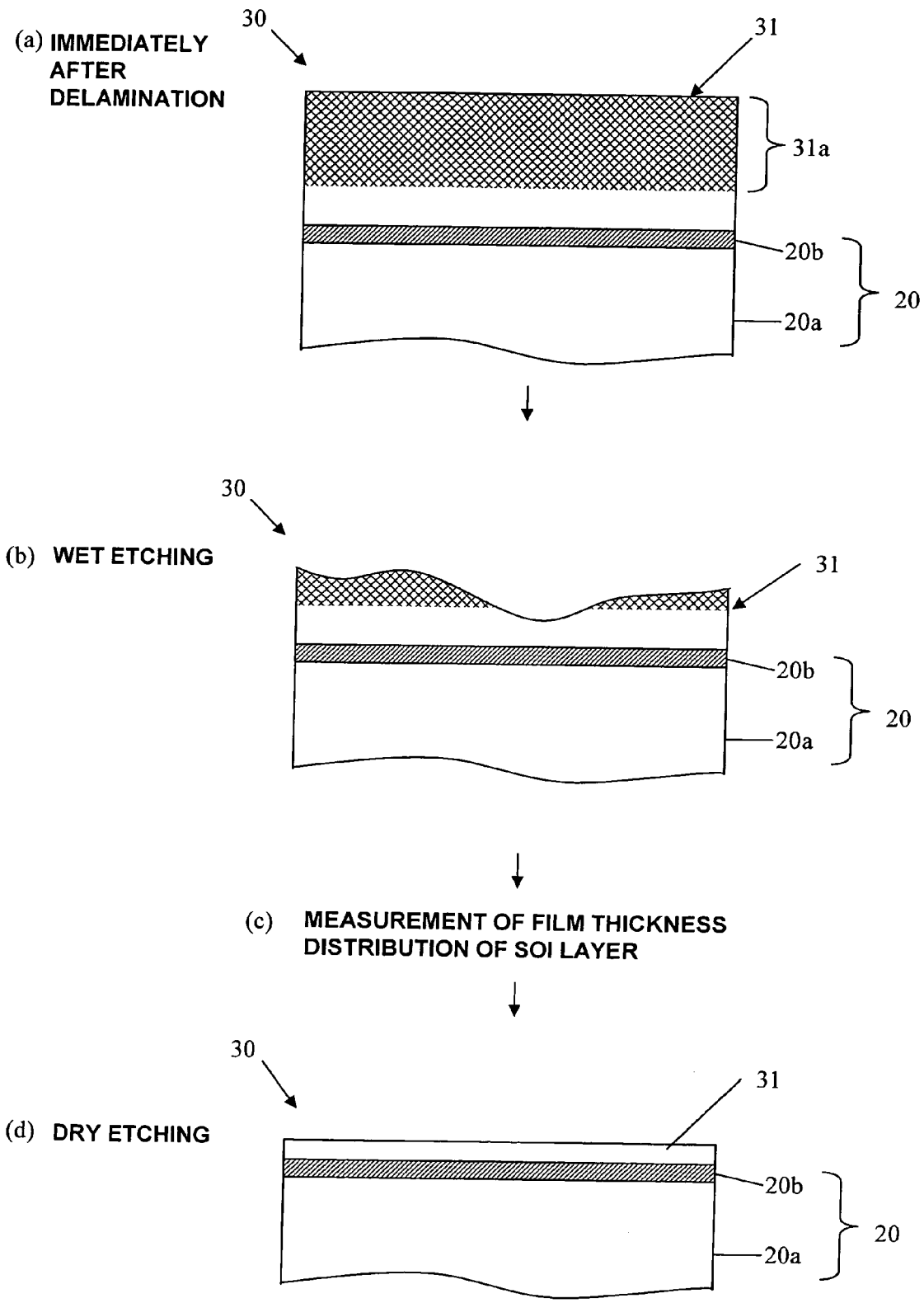
FIG. 1 is a flow diagram showing an example of an etching step in a method for manufacturing an SOI wafer according to the present invention.

FIG. 1 is a flow diagram showing each stage effected during the etching step (FIG. 2(5)) in the method for manufacturing an SOI wafer according to the present invention.

First, immediately after end of the delamination step as Step 4, as shown in FIG. 1(a), the SOI layer 31 consisting of single-crystal silicon is formed on the handle wafer 20. Furthermore, an ion implantation damage layer 31a is formed near a surface of the SOI layer 31 (a region close to the ion implanted layer). A thickness of the ion implantation damage layer 31a is usually approximately 0.1 to 0.12 μm. An object of etching the SOI layer 31 to reduce a thickness thereof is obtaining the thin SOI layer 31 as well as removing this ion implantation damage layer 31a.

Moreover, as shown in FIG. 1(b), the SOI wafer 30 is put into a wet etching device, and the SOI layer 31 is subjected to rough etching based on wet etching (Stage b).

An etchant in wet etching is not restricted in particular as long as a certain degree of film thickness uniformity can be obtained, and a usually utilized etchant can be used. For example, it is possible to use an etchant containing at least one of KOH, $NH_4OH$, a mixed solution of $NH_4OH+H_2O_2$, NaOH, CsOH, EDP (ethylenediamine-pyrocatechol), TMAH (tetramethylammonium hydroxide), and hydrazine.

It is to be noted that an etching removal on this rough etching stage can be controlled based on an etching rate determined by a type of an etchant or an etching temperature, a time for performing etching, and others.

According to etching based on such wet etching, a film thickness of the SOI layer 31 can be reduced at a relatively high etching rate.

On the other hand, according to this etching based on wet etching, uniformly etching the entire wafer surface is difficult, and etching unevenness of approximately ±10% occurs. Therefore, film thickness uniformity of the SOI layer 31 is relatively poor, and a film thickness distribution of, e.g., approximately ±10 to 30% is produced. Therefore, film thickness uniformity of this SOI layer 31 is often deteriorated as compared with that immediately after delamination of the donor wafer 10 (see FIG. 1(a)).

However, such deterioration in film thickness uniformity due to etching unevenness can be corrected on a subsequent precise etching stage, and hence it cannot be a specific problem in the present invention.

Then, as shown in FIG. 1(c), the film thickness distribution of the SOI layer 31 after rough etching is measured (Stage c). The film thickness distribution can be highly accurately measured based on, e.g., an optical interference method or an electrostatic capacitance method.

The next precise etching stage using dry etching is carried out based on data of the thus measured film thickness distribution.

Then, as shown in FIG. 1(d), the SOI wafer 30 is put into a dry etching device, and precise etching using dry etching is carried out based on the film thickness distribution of the SOI layer measured on Stage c (Stage d). An etching technique on this precise etching stage is a technique that can precisely correct film thickness uniformity, e.g., a PACE method or a GCIB method.

The PACE method is a method for uniforming a thickness of a wafer (a film thickness of the SOI layer) while locally etching the surface of the wafer by using a plasma gas, and the wafer surface can have a high flatness degree by measuring a thickness distribution of the wafer based on the optical interference method or the electrostatic capacitance method and then controlling an amount of etching removal using the plasma gas in accordance with this thickness distribution.

The GCIB method is a method for forming a massive atom cluster of a gaseous material (a gas cluster) at an ordinary temperature and an ordinary pressure, using an accelerating voltage to accelerate a gas cluster ion generated by applying electrons to this massive atom cluster, and irradiating the wafer surface with this accelerated ion. Like the PACE method, the wafer surface can have a high flatness degree by measuring a thickness distribution of the wafer based on, e.g., the optical interference method or the electrostatic capacitance method and then controlling an amount of etching removal using the gas cluster ion in accordance with this thickness distribution.

Specific conformations of the PACE method or the GCIB method are not restricted in particular, and known apparatuses and methods can be appropriately used.

Moreover, an etching gas used on the precise etching stage based on dry etching is not restricted in particular, but both the PACE method and the GCIB method can be carried out by using a gas containing at least one of $SF_6$, $NF_3$, $CF_4$, $CHF_3$, HBr, $Cl_2$, $O_2$, and $H_2$.

It is to be noted that an etching removal on this precise etching stage can be controlled based on a type of the etching gas, a concentration of the etching gas, a pressure, and others or a time for performing etching.

Additionally, in regard to a range of the etching removal on this precise etching stage, a lower limit that enables sufficiently correcting film thickness uniformity of the SOI layer 31 can suffice, and it can be set to, e.g., 10 nm or above, though this value varies depending on a degree of film thickness uniformity of the SOI layer after end of the rough etching stage. Further, lowering an upper limit as much as possible is preferable in order to improve productivity of the entire etching step, and it can be set to, e.g., 100 nm or below, though this value likewise varies depending on a degree of film thickness uniformity of the SOI layer after end of the rough etching stage.

Furthermore, after end of this precise etching stage, film thickness uniformity of the SOI layer 31 is improved as compared with that obtained after end of the rough etching stage.

Moreover, although an etching rate of this etching based on dry etching is lower than that of etching based on wet etching, rough etching is carried out before precise etching in the present invention, and an etching removal on the precise etching stage can be set to a small value. Therefore, a reduction in productivity can be suppressed to the requisite minimum.

As explained above, sequentially carrying out the rough etching stage and the precise etching stage enables performing etching at a relatively high etching rate on the rough etching stage and increasing film thickness uniformity of the SOI layer 31 on the precise etching stage. As a result, a high polishing rate and high film thickness uniformity can be obtained at the entire etching step for the SOI layer, and hence the SOI wafer 30 having the SOI layer 31 with high film thickness uniformity can be manufactured with excellent productivity (with a high throughput).

It is to be noted that an etching removal on each of the rough etching stage as Stage b and the precise etching stage as Stage d can be appropriately optimized based on a total time required for the etching step, film thickness uniformity of the finally obtained SOI layer, and others. In particular, when the etching removal on the precise etching stage is set smaller than the etching removal on the rough etching stage, the SOI wafer having the SOI layer with high film thickness uniformity can be further efficiently manufactured, which is preferable. For example, when the etching removal at the entire etching step (a total etching removal) is set to 150 nm, the etching removal based on rough etching can be set to 120 nm corresponding to 80% of the total etching removal, and the etching removal based on precise etching can be set to 30 nm corresponding to 20% of the total etching removal.

Further, when a batch process is used on the rough etching stage, a large quantity of SOI wafers can be etched at a time, which is effective for improving productivity.

On the other hand, even if the SOI layer is etched by using, e.g., a single-wafer processing type spin cleaner, an etching rate of rough etching based on wet etching is high from the beginning, which does not greatly affect a reduction in productivity. Furthermore, when wet etching is performed by using, e.g., the spin cleaner in this manner, uniform etching can be performed as compared with the batch process, and hence there is a merit that etching can be performed to obtain a thickness close to a target final film thickness and an etching time of the precise etching stage can be reduced.

Moreover, when the above-explained steps (FIGS. 2(1) to 2(5) and FIGS. 1(a) to 1(d)) are used, the SOI wafer 30 in which a film thickness of the SOI layer 31 is as very thin as, e.g., 100 nm or below and the SOI layer 31 has high film thickness uniformity can be manufactured with excellent productivity.

Additionally, since delamination of the donor wafer 10 before the etching step is carried out by using the ion implantation/delamination method, a film thickness of approximately 2 μm or below can be previously given to the SOI layer after end of the delamination step and before the etching step. Even in the present invention that further reduces the thickness of the SOI layer by etching, the etching removal at the etching step can be set to a minimum value. Therefore, a time required for the etching step is short, thus increasing productivity.

Further, since the bonding method for bonding the two wafers is adopted, a film quality of the SOI layer 31 is high as compared with that obtained by a so-called SIMOX method.

Meanwhile, as explained above, as to delamination of the donor wafer 10, the donor wafer 10 may be delaminated by applying a mechanical external force. Such an example will now be explained hereinafter.

After end of the ion implantation step (Step 2), a surface activation treatment is performed with respect to the ion implanted surface 12 of the donor wafer 10 and the bonding surface 22 of the handle wafer 20.

Of course, the surface activation treatment may be performed with respect to one of the ion implanted surface 12 of the donor wafer 10 and the bonding surface 22 of the handle waver 20.

At this time, it is preferable to carry out the surface activation treatment based on at least one of a plasma treatment and an ozone treatment. When the surface activation treatment is carried out based on at least one of the plasma treatment and the ozone treatment, the surface subjected to the surface activation treatment is activated. For example, OH groups of this surface are increased. Therefore, when the ion implanted surface 12 of the donor wafer is pressed against the bonding surface 22 of the handle wafer in this state, the wafers can be more firmly bonded to each other based on, e.g., hydrogen bonding.

When the treatment is performed by using a plasma, a wafer subjected to cleaning, e.g., RCA cleaning is put in a vacuum chamber, a plasma gas is introduced, and then the wafer is exposed to a high-frequency plasma of approximately 100 W for approximately 5 to 30 seconds to perform a plasma treatment with respect to a surface thereof. As the plasma gas, it is possible to use a plasma of an oxygen gas when processing a single-crystal silicon wafer having an oxide film formed on a surface thereof, or a hydrogen gas, an argon gas, a mixed gas of these gases, or a mixed gas of the hydrogen gas and a helium gas when processing a single-crystal silicon wafer having no oxide film formed on a surface thereof. Further, a nitrogen gas as an inert gas may be used.

When the treatment is performed by using an ozone, a wafer subjected to cleaning, e.g., RCA cleaning is set in a chamber having atmospheric air introduced therein, a plasma gas, e.g., a nitrogen gas or an argon gas is introduced, a high-frequency plasma is produced, and oxygen in the atmospheric air is converted into an ozone, thereby performing the ozone treatment with respect to a surface of the wafer.

Then, the ion implanted surface 12 of the donor wafer is pressed against the bonding surface 22 of the handle wafer (Step 3).

When the surface subjected to the surface activation treatment is determined as a bonding surface and the wafers are pressed against each other under a reduced pressure or a normal pressure at a room temperature in this manner, both the wafers can be sufficiently firmly bonded to each other so that they can resist subsequent mechanical delamination even if a high-temperature treatment is not performed.

It is to be noted that a heat treatment step for performing a heat treatment with respect to the appressed wafers at 100 to 400° C. may be effected after the step of pressing the donor wafer and the handle wafer against each other.

When the appressed wafers are subjected to the heat treatment at 100 to 400° C. after the donor wafer and the handle wafer are pressed against each other in this manner, bonding strength of the donor wafer and the handle wafer can be increased. In particular, when a heat treatment temperature is 100 to 300° C., a possibility of occurrence of thermal damages, cracks, delamination, and others due to a difference between thermal expansion coefficients is low even if different material types of wafers are bonded to each other. Increasing the bonding strength enables reducing occurrence of failures at the delamination step.

Then, a mechanical external force is applied to the bonded wafers to delaminate the donor wafer 10, and a film thickness of the donor wafer 10 is reduced to provide the SOI layer 31 (Step 4).

For example, the donor wafer 10 and a back surface of the handle wafer 20 (a surface opposite to the bonding surface) are held by holding jigs, an external impact shock is given to a position near the ion implanted layer 11 by, e.g., a wedge-shaped member or a high-pressure fluid such as air, a nitrogen gas, or pure water to start delamination of the donor wafer 10 while applying a force that can separate both the holding jigs from each other, and both the holding jigs are relatively separated from each other. Consequently, the donor wafer 10 is gradually separated from the handle wafer 20 at the ion implanted layer 11 from one end portion to which the external impact shock has been given toward the other end portion, thereby delaminating the donor wafer 10.

After the delamination step (Step 4) for the donor wafer 10 is carried out in this manner, the etching step (Step 5) is effected by sequentially performing wet etching and dry etching like the example where delamination is performed based on the heat treatment.

EXAMPLES

Although the present invention will now be specifically explained based on examples and comparative examples, the present invention is not restricted thereto.

Example 1

An SOI wafer was manufactured by a method of performing delamination of a donor wafer based on a heat treatment as follows in accordance with the method for manufacturing an SOI wafer of the present invention depicted in FIGS. 2 and 1.

First, as Step 1, a mirror-polished single-crystal silicon wafer having a diameter of 200 nm was prepared as a donor wafer 10. Further, a silicon oxide film layer having a thickness of 100 nm was formed on a surface of the donor wafer by thermal oxidation.

Furthermore, a single-crystal silicon wafer having a diameter of 200 mm was prepared as a handle wafer 20. Moreover, a silicon oxide film 20b having a thickness of 1 μm was formed on a surface of the handle wafer by thermal oxidation.

Then, a hydrogen ion was implanted into the donor wafer 10 through the silicon oxide film layer formed thereon, thereby forming a micro bubble layer (an ion implanted layer) 11 at an average progress depth of the ion in parallel with the surface (Step 2). As ion implantation conditions, an implantation energy is 35 keV, an implantation dose is $9 \times 10^{16}/cm^2$, and an implantation depth is 0.3 μm.

Subsequently, an ion implanted surface 12 of the donor wafer 10 was brought into contact with and bonded to the handle wafer 20 through the silicon oxide film 20b in a clean atmosphere at an ordinary temperature (Step 3).

Then, a heat treatment was applied in an Ar gas atmosphere at 500° C. for 30 minutes to delaminate the donor wafer 10 at the ion implanted layer 11 (Step 4). That is, a delamination step was carried out based on the heat treatment.

Subsequently, a bonding heat treatment was effected in an Ar gas atmosphere containing 1% of oxygen at 1000° C. to 1250° C. for 1 hour, thereby increasing a bonding power of the donor wafer 10 and the handle wafer 20.

Then, an etching step as Step 5 was carried out through the following stages.

First, a rough etching stage based on wet etching using a KOH liquid solution was carried out to etch an SOI layer 31 for approximately 120 nm (a stage a).

Subsequently, a film thickness distribution of the SOI layer 31 was measured based on an optical interference method (Stage b).

Then, a precise etching stage as dry etching was used to etch the SOI layer 31 for approximately 30 nm based on a PACE method using an $SF_6$ gas (Stage c).

In this manner, the SOI layer was etched for approximately 150 nm in total.

Example 2

Like Example 1, a delamination step as Step 4 was carried out in the form of delamination based on a heat treatment, but a dry etching step as Stage c in an etching step as Step 5 was performed by using a GCIB method, thereby manufacturing an SOI wafer.

Example 3

Processing was performed like Example 1, but delamination of a donor wafer 10 was carried out by applying a mechanical external force as follows.

After ion implantation at Step 2, an ion implanted donor wafer 10 was put in a plasma treatment device, nitrogen was introduced as a plasma gas, and then a high frequency of 13.56 MHz was applied to a space between parallel plate electrodes each having a diameter of 300 mm under conditions of a reduced pressure of 2 Torr (270 Pa) and a high-frequency power of 50 W, thereby effecting a high-frequency plasma treatment to an ion implanted surface for 10 seconds. In this manner, the ion implanted surface of the donor wafer 10 was subjected to a surface activation treatment.

On the other hand, a handle wafer 20 was put in a plasma treatment device, a nitrogen gas as a plasma gas was introduced into a space between narrow electrodes, and then a high frequency was applied to the space between the electrodes to generate a plasma, thereby performing a high-frequency plasma treatment for 10 seconds. In this manner, a bonding surface of the handle wafer 20 was also subjected to a surface activation treatment.

Surfaces of the donor wafer 10 and the handle wafer 20 subjected to the surface activation treatments as explained above were determined as bonding surfaces, the donor wafer 10 and the handle wafer 20 were pressed against each other at a room temperature, and then back surfaces of both the wafers were strongly pressed in a thickness direction (Step 3).

Then, a wafer in which the donor wafer 10 is appressed against the handle wafer 20 was subjected to a heat treatment at 300° C. for 30 minutes in order to increase bonding strength.

Subsequently, the donor wafer 10 and the back surface of the handle wafer 20 were held by holding jigs, an external impact shock was given to a position near the ion implanted layer 11 by a gas fluid to start delamination of the donor wafer 10 while applying a force that can separate both the holding jigs from each other, and both the holding jigs were relatively separated from each other. Consequently, the donor wafer 10 was gradually separated from the handle wafer 20 at the ion implanted layer 11 from one end portion having the external impact shock given thereto toward the other end portion, thereby delaminating the donor wafer 10 by the mechanical external force (Step 4).

Then, an etching step as Step 5 was carried out by effecting a wet etching stage, then measuring a film thickness distribution of an SOI layer, and carrying out a dry etching step based on the PACE method like Example 1.

Example 4

A delamination step as Step 4 was performed in the form of delamination using a mechanical external force like Example 3, but a dry etching step as Stage c in an etching step as Step 5 was performed by using a GCIB method, thereby manufacturing an SOI wafer.

Comparative Example 1

A delamination step as Step 4 was carried out in the form of delamination using a heat treatment like Example 1, but an etching step as Step 5 was carried out based on a wet etching stage alone using a KOH liquid solution without adopting such a stage as depicted in FIG. 1, thereby manufacturing an SOI wafer.

Comparative Example 2

A delamination step as Step 4 was performed in the form of delamination using a mechanical external force like Example 3, but an etching step as Step 5 was effected based on a wet etching stage alone using a KOH liquid solution without adopting such a stage as depicted in FIG. 1, thereby manufacturing an SOI wafer.

Comparative Examples 3 and 4

A delamination step as Step 4 was performed in the form of delamination based on a heat treatment like Example 1, but an etching step as Step 5 was carried out based on a dry etching stage alone adopting the PACE method (Comparative Example 3) or the GCIB method (Comparative Example 4) using an $SF_6$ gas without using such a stage as depicted in FIG. 1, thereby manufacturing an SOI wafer.

Comparative Examples 5 and 6

A delamination step as Step 4 was carried out by using a mechanical external force like Example 3, but an etching step as Step 5 was performed based on a dry etching stage alone adopting the PACE method (Comparative Example 5) or the GCIB method (Comparative Example 6) using an $SF_6$ gas without utilizing such a stage as depicted in FIG. 1, thereby manufacturing an SOI wafer.

The following Table 1 collectively shows a method for manufacturing an SOI wafer, a total time required for the etching step as Step 5, and film thickness uniformity of an SOI layer in each of Examples 1 to 4 and Comparative Examples 1 to 6.

It is to be noted that a total time required for the etching step is a period from a moment at which an SOI wafer is put into a wet etching device to a moment at which the SOI wafer is carried out from a dry etching device in Examples 1 to 4. A total time required for the etching step is a period from a moment at which the SOI wafer is put into each etching device to a moment at which the SOI wafer is carried out from each etching device in Comparative Examples 1 to 6.

TABLE 1

| | Delamination step | Etching step | Etching step total time (minutes) | Film thickness uniformity (%) |
|---|---|---|---|---|
| Example 1 | Heat treatment | Wet + PACE | 15 | 5 |
| Example 2 | Heat treatment | Wet + GCIB | 15 | 5 |
| Example 3 | Mechanical external force | Wet + PACE | 15 | 5 |
| Example 4 | Mechanical external force | Wet + GCIB | 15 | 5 |
| Comparative Example 1 | Heat treatment | Wet | 5 | 30 |
| Comparative Example 2 | Mechanical external force | Wet | 5 | 30 |
| Comparative Example 3 | Heat treatment | PACE | 60 | 5 |
| Comparative Example 4 | Heat treatment | GCIB | 60 | 5 |
| Comparative Example 5 | Mechanical external force | PACE | 60 | 5 |
| Comparative Example 6 | Mechanical external force | GCIB | 60 | 5 |

Each of Examples 1 to 4 conforms to the present invention where the etching step is carried out on two stages, i.e., wet etching and dry etching (the PACE method or the GCIB method), and was able to obtain high film thickness uniformity of approximately 5%. Further, although the wafer must again put into the dry etching device from the wet etching device, a time required for the etching step where the SOI layer is etched for 150 nm is as short as approximately 15 minutes in each of these examples.

Furthermore, using either the delamination method for performing delamination based on a heat treatment and the delamination method for performing delamination by applying a mechanical external force enabled obtaining the effect of the present invention.

In each of Comparative examples 1 and 2, the etching step was performed based on wet etching alone, and a time required for the etching step was as short as approximately five minutes as compared with Examples 1 to 4, but film thickness uniformity of approximately 3% with a great fluctuation was obtained.

In each of Comparative Examples 3 to 6, the etching step was performed based on dry etching (the PACE method or the GCIB method) alone, and film thickness uniformity was approximately 5% which is equivalent to that in each of Examples 1 to 4, but productivity was poor since a time required for the etching step was as long as approximately 60 minutes.

Based on the above-explained results, according to the method for manufacturing an SOI wafer of the present invention, it was revealed that the SOI wafer having the SOI layer with high film thickness uniformity which is substantially equivalent to that of an SOI layer etched based on dry etching like the PACE method or the GCIB method can be manufactured with far better productivity than that in the conventional examples.

It is to be noted that the present invention is not restricted to the foregoing examples. The examples are just exemplifications, and any examples, which have substantially the same structures as technical concepts described in claims of the present invention and demonstrate the same functions and effects are included in the technical scope of the present invention.

What is claimed is:

1. A method for manufacturing an SOI wafer comprising at least:

a step of preparing a handle wafer and a donor wafer formed of a silicon substrate, the handle wafer being selected from the group consisting of a quartz wafer, a glass wafer, an alumina (sapphire) wafer, a SiC wafer, and an aluminum nitride wafer;

an ion implantation step of implanting at least one of a hydrogen ion and a rare gas ion into the donor wafer to form an ion implanted layer;

a bonding step of bonding an ion implanted surface of the donor wafer to a bonding surface of the handle wafer;

a delamination step of delaminating the donor wafer at the ion implanted layer to reduce a film thickness of the donor wafer, thereby providing an SOI layer; and an etching step of etching the SOI layer to reduce a thickness of the SOI layer, wherein:

the etching step includes:

a stage of performing rough etching as wet etching;

a stage of measuring a film thickness distribution of the SOI layer after the rough etching; and a stage of performing precise etching as dry etching by a PACE method or a GOB method based on the measured film thickness distribution of the SOT layer, the method is performed without forming an etch stop layer, and an etching removal on the precise etching stage is set smaller than an etching removal on the rough etching stage and is set in a range of 10 nm to 100 nm.

2. The method for manufacturing an SOI wafer according to claim 1, wherein a silicon substrate as the donor wafer is a single-crystal silicon wafer or a single-crystal silicon wafer having a silicon oxide film formed on a surface thereof.

3. The method for manufacturing an SOI wafer according to claim 1, wherein the wet etching is performed by using an etchant containing at least one of KOH, $NH_4OH$, a mixed solution of $NH_4OH+H_2O_2$, NaOH, CsOH, EDP, TMAH, and hydrazine.

4. The method for manufacturing an SOI wafer according to claim 1, wherein the dry etching is performed by using a gas containing at least one of $SF_6$, $NF_3$, $CHF_3$, HBr, $Cl_2$, $O_2$, and $H_2$.

* * * * *